United States Patent
Kereit et al.

(10) Patent No.: US 8,390,298 B2
(45) Date of Patent: Mar. 5, 2013

(54) METHOD FOR DETERMINATION OF A SETTING VALUE WHICH INDICATES A GROUND IMPEDANCE, AND MEASUREMENT DEVICE

(75) Inventors: Matthias Kereit, Berlin (DE); Tevfik Sezi, Erlangen (DE)

(73) Assignee: Siemens Aktiengesellschaft, Munich (DE)

(*) Notice: Subject to any disclaimer, the term of this patent is extended or adjusted under 35 U.S.C. 154(b) by 601 days.

(21) Appl. No.: 12/599,141

(22) PCT Filed: May 8, 2007

(86) PCT No.: PCT/DE2007/000870
§ 371 (c)(1),
(2), (4) Date: Nov. 6, 2009

(87) PCT Pub. No.: WO2008/134998
PCT Pub. Date: Nov. 13, 2008

(65) Prior Publication Data
US 2010/0301872 A1    Dec. 2, 2010

(51) Int. Cl.
*G01R 31/14* (2006.01)
*G01R 31/08* (2006.01)

(52) U.S. Cl. ......... 324/512; 324/509; 324/522; 324/525

(58) Field of Classification Search ............... 324/512, 324/522–524, 525, 509, 539–544
See application file for complete search history.

(56) References Cited

U.S. PATENT DOCUMENTS 5,446,387 A * 8/1995 Eriksson et al. .............. 324/522
5,929,642 A   7/1999 Philippot et al.
6,097,280 A   8/2000 Takeda et al.

FOREIGN PATENT DOCUMENTS

DE  4441334 C1  7/1996
EP  0795944 A2  9/1997

OTHER PUBLICATIONS

Schmidt et al. (EPA0795944, Sep. 17, 1997, English Translation, Description, pp. 1-11 and Claims, pp. 1-3).*
Schmidt et al., Method for determining the operating parameters of at least one distance relay, Sep. 17, 1997, description, pp. 1-14, claim pp. 1-3.*

* cited by examiner

*Primary Examiner* — Melissa Koval
*Assistant Examiner* — Farhana Hoque
(74) *Attorney, Agent, or Firm* — Laurence A. Greenberg; Werner H. Stemer; Ralph E. Locher

(57) ABSTRACT

A method for determining an adjustment value for an electrical protection device wherein, upon occurrence of a ground short circuit, first current indicator measured values and first voltage indicator measured values are captured by a first measurement device at a first end of a segment of an electrical power supply line, and second current indicator measured values and second voltage indicator measured values are captured by a second measurement device at a second end of the segment of an electrical power supply line. In order to design a method of this type such that an adjustment value for a ground impedance can be determined in a relatively simple fashion. A fault location value is determined using the first current and voltage indicator measured values and the second current and voltage indicator measured values, indicating a fault location at which the ground short circuit has occurred in the segment of the electrical power supply line, and an adjustment value indicating a ground impedance is calculated using the fault location value. There is also provided a correspondingly equipped measurement device.

15 Claims, 4 Drawing Sheets

METHOD FOR DETERMINATION OF A SETTING VALUE WHICH INDICATES A GROUND IMPEDANCE, AND MEASUREMENT DEVICE

BACKGROUND OF THE INVENTION

Field of the Invention

The invention relates to a method for determination of a setting value for an electrical protective device, in which, when a ground short occurs, a first measurement device is used to record first current phasor measured values and first voltage phasor measured values at a first end of a section of an electrical power supply line, and a second measurement device is used to record second current phasor measured values and second voltage phasor measured values at a second end of the section of the electrical power supply line. The invention also relates to a measurement device having a recording device, which is designed to record first current phasor measured values and first voltage phasor measured values which are present at a first end of a line section, and a communication device, which is designed to receive second current phasor measured values and second voltage phasor measured values which are recorded by means of a further measurement device at a second end of a line section.

So-called electrical protective devices are normally used for monitoring and for protection of electrical power supply systems. An electrical protective device records measured values at a measurement point in the electrical power supply system, which measured values characterize an operating state of the electrical power supply system. By way of example, these may be current and voltage measured values. The protective device uses these measured values and specific protection algorithms to decide whether that part of the electrical power supply system which is being monitored by it is in a permissible operating state or an impermissible operating state. An impermissible operating state occurs, for example, when a short has occurred in the monitored part of the electrical power supply system. When an impermissible operating state occurs, then the protective device normally automatically emits a so-called "trip command" to a circuit breaker associated with it, which, as a reaction to the trip command, opens its switching contacts and therefore disconnects the faulty section from the rest of the power supply system.

By way of example, one electrical protective device that is frequently used is a so-called distance protective device. A distance protective device such as this measures currents and voltages which occur at a measurement point in an electrical power supply line, and uses them to calculate an impedance value of the electrical power supply line. By way of example, it is possible to use the calculated impedance value, with the assistance of specific characteristics, to check whether a short has occurred on the electrical power supply line. In this case, the distance protective device uses the measured currents and voltages to determine, so to speak, a fault location, which indicates the location at which a short has occurred on the electrical power supply line. If the fault location is within the monitored section of the electrical power supply line, then the distance protective device emits a trip command to a circuit breaker that is associated with it, which then disconnects the faulty section of the electrical power supply line from the rest of the power supply system. Distance protective devices are frequently used to monitor electrical power supply lines, because they have high selectivity and are able to make autonomous decisions without any need for communication with another protective device to do so.

By way of example, shorts can occur between two or three phases of the power transmission line (a so-called "conductor-conductor short") or between one respective phase and the electrical ground (a so-called "conductor-ground short"). In the case of a conductor-conductor short between two or three phases of the electrical power supply line, the fault location can be calculated very reliably since the impedances which are required to calculate the fault location of the lines affected by the fault are normally known.

However, conductor-ground shorts occur considerably more frequently than conductor-conductor shorts, and these are essentially single-phase shorts, associated with ground. To calculate the fault location in the event of conductor-ground shorts such as these, it is necessary to know the ground impedance of the ground itself which is involved in the conductor-ground loop that is measured by the distance protective device.

The setting value which is used for the ground impedance and must be set as a parameter in the electrical distance protective device has until now been derived, for example, from parameters of the electrical power supply line, for example the zero phase sequence system impedance and the positive phase sequence system impedance of the electrical power supply line. In this case, there is a risk of calculation errors. Furthermore, the values determined in this way for the ground impedance are comparatively inaccurate, since the actual ground impedance is merely estimated by means of data that is applicable to the line. Another possibility is to carry out measurements of the ground impedance. To do this, the corresponding section of the electrical power supply line must be disconnected. Measurements such as these are relatively expensive and complex.

In a general form, a method for determination of setting values for electrical protective devices is known, for example, from European patent application EP 0 795 944 A2. In the known method, parameters of the electrical power supply lines are determined by measurement of currents and voltages at two points on the line, and calculation of a chain matrix for the power supply line. However, the known method does not address explicit determination of the ground impedance.

BRIEF SUMMARY OF THE INVENTION

The invention is therefore based on the object of specifying a method and a measurement device of the type mentioned above which allow a setting value for the ground impedance to be determined comparatively easily and accurately.

With regard to the method, the object is achieved by a method of the generic type in which the first current and voltage phasor measured values and the second current and voltage phasor measured values are used to determine a fault location value, which indicates a fault location at which the ground short has occurred on the section of the electrical power supply line, and the fault location value is used to calculate a setting value, which indicates a ground impedance.

The invention is based on the knowledge that, when a fault is located from two ends, that is to say a fault location is calculated using current and voltage phasor measured values which have been recorded at two ends of a relevant section of a grounded electrical power supply line, it is not necessary to know the ground impedance of the ground itself that is involved. It is therefore possible to determine a fault location value by means of such fault location from two ends, without knowledge of the ground impedance. Algorithms for fault location from two ends are generally known in specialist circles. For example, fault location from two ends can be carried out as described in German patent specification DE 4441334 C1.

In a further step, the fault location value determined by fault location from two ends can be used to determine that value for the ground impedance which would have led to the same fault location if fault location had been carried out from one end, that is to say the fault location had been determined by one protective device on its own. This value of the ground impedance can be used as the sought setting value.

The setting value can in this case be determined specifically using the equation:

$$Z_E = \frac{U_A - I_{AL} m Z_L - U_F}{m I_{AE}}$$

in which the following formula symbols are used:
$Z_E$: ground impedance;
$\underline{U}_A$: voltage phasor measured by the first measurement device;
$\underline{I}_{AL}$: current phasor measured by the first measurement device;
m: distance from the first measurement device to the fault location, with respect to the length of the monitored section of the line;
$\underline{Z}_L$: positive phase sequence system impedance of the section of the line;
$U_E$ voltage drop at the fault location;
$\underline{I}_{AE}$: ground current measured by the first measurement device.

One advantageous embodiment of the method according to the invention provides that the first current and voltage phasor measured values are recorded by the first measurement device, and the second current and voltage phasor measured values are recorded by the second measurement device, synchronously in time.

A relatively simple two-ended fault location algorithm can in this way be used to calculate the fault location value, since the algorithm does not require subsequent synchronization of the first and second current and voltage phasor measured values.

In this context, it is considered to be advantageous for the first and second current and voltage phasor measured values to be provided with a time stamp which indicates that point in time at which the respective current and voltage phasor measured values were recorded. The time stamp makes it easier to associate the synchronously recorded current and voltage phasor measured values.

In this context, it is also advantageous if an internal timer is used to produce the time stamp in the respective measurement device. By way of example, an internal timer such as this may be clocked by a crystal oscillator.

In order to synchronize the internal timers of the respective measurement devices, it may be advantageous for the respective internal timers of the measurement devices to be synchronized via a common external timer.

By way of example, one such external timer may be a GPS satellite, which transmits a regularly pulsed signal.

According to a further advantageous embodiment of the method according to the invention, it is possible that the recorded second current and voltage phasor measured values are transmitted via a communication link from the second measurement device to the first measurement device.

In this case, the first measurement device can calculate the fault location value and the setting value. This allows one of the measurement devices itself to determine the setting value. The communication link may be a single communication link with a comparatively low data transmission capacity, and need not necessarily exist continuously, and, in fact, it may be sufficient to set up a temporary communication link for transmission of the current and voltage phasor measured values. In particular, there is no need to transmit the current and voltage phasor measured values before disconnection of the short, because the setting value for the ground impedance will normally be calculated after disconnection of the short.

As an alternative to this, according to another advantageous embodiment, it is possible that the first current and voltage phasor measured values are transmitted from the first measurement device to the second measurement device, and the second current and voltage phasor measured values are transmitted from the second measurement device to the first measurement device via a communication link.

In this case, both measurement devices calculate the fault location value and the setting value. This results in redundant calculation of the setting value, thus making it possible to minimize the risk of an incorrect determination resulting from the comparison of the setting values determined in both measurement devices.

Alternatively, a further advantageous embodiment of the method according to the invention provides that both the first current and voltage phasor measured values from the first measurement device and the second current and voltage phasor measured values from the second measurement device are transmitted to a computation device, and the computation device calculates the fault location value and the setting value.

This allows comparatively simple measurement devices to be used as measurement devices, which do not need to have a particularly high computation capacity. The fault location value and the setting value are calculated in an external computation device, to which the measurement devices transmit their current and voltage phasor measured values.

In addition, a further advantageous embodiment of the method according to the invention provides that the setting value is used to set a ground impedance parameter of an electrical distance protective device.

As an alternative to this, it is possible that a setting value is calculated for each of a plurality of ground shorts, and a mean value is determined from the calculated setting values and is used to set a ground impedance parameter of a distance protective device. This avoids incorrect setting of the setting value for the case of a so-called "spurious value", since a mean value is first of all determined over a plurality of setting values which have been calculated for different ground shorts, and the mean value is then used as the setting value.

With regard to the measurement device, the object mentioned above is achieved by a measurement device of the type mentioned initially wherein the data processing device is designed to calculate a fault location value, which indicates the location of a ground short on the line section, from the recorded first current and voltage phasor measured values and the received second current and voltage phasor measured values, and to calculate a setting value, which indicates a ground impedance, from the fault location value.

In this context, it is considered to be particularly advantageous for the measurement device to be an electrical distance protective device. In this case, the measured value recording of the distance protective device can also be used to calculate the setting value; no separate measurement device is required.

BRIEF DESCRIPTION OF THE SEVERAL VIEWS OF THE DRAWING

The invention will be explained in more detail in the following text with reference to exemplary embodiments. In this case, in the figures.

DESCRIPTION OF THE INVENTION

Figure 1:
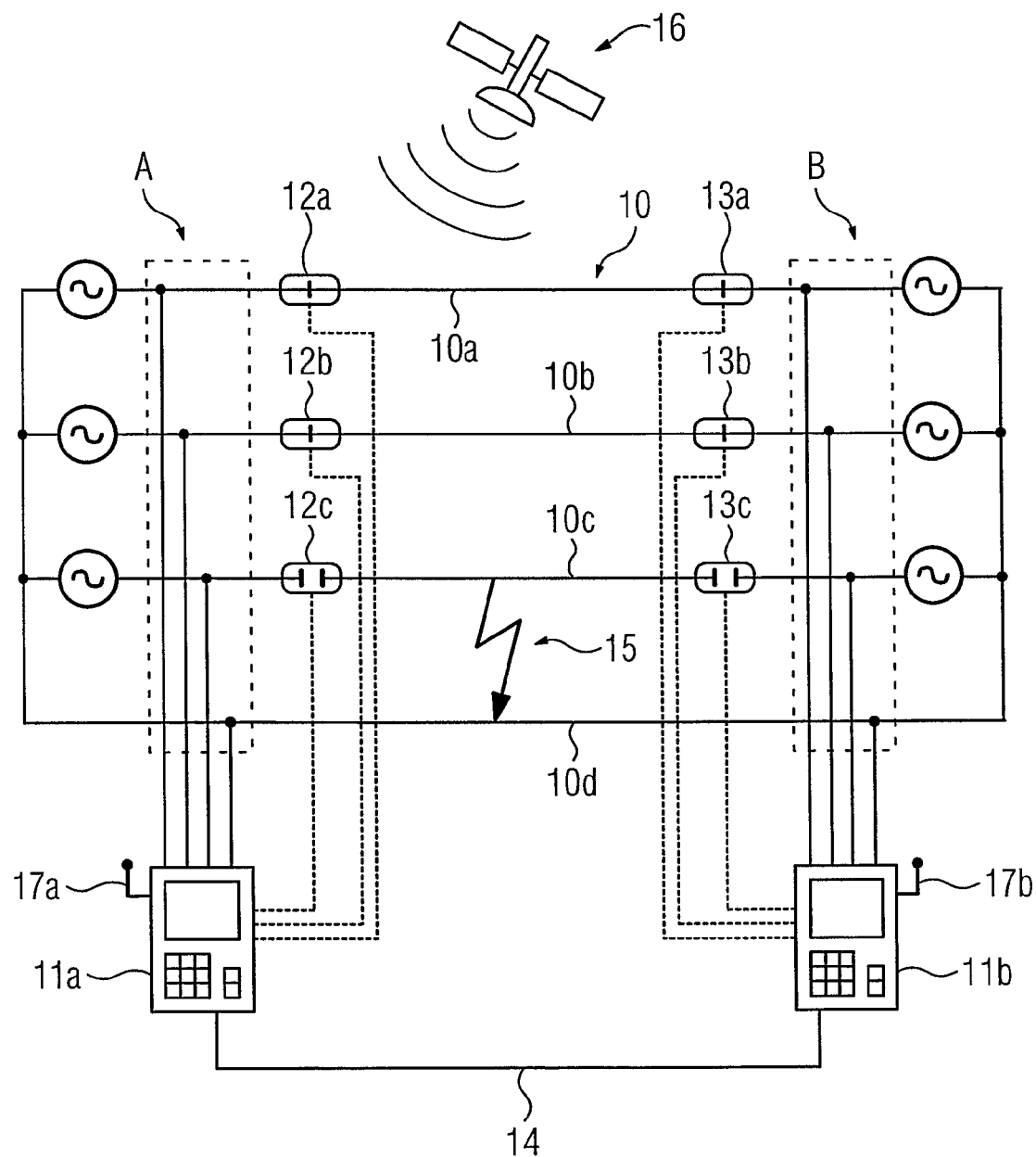
FIG. 1 shows a schematic illustration of a section of a three-phase power transmission line with a first and a second measurement device.

FIG. 1 shows a section 10 of a grounded three-phase power transmission line, which is not illustrated in any more detail. Although the following is based on a three-phase system, the invention is also applicable to systems with more or less than three phases.

The section 10 comprises a first phase 10a, a second phase 10b and a third phase 10c. The reference symbol 10d denotes an electrical ground, which is common to all three phases 10a, 10b, 10c.

A measurement device in the form of an electrical distance protective device 11a is arranged at a first measurement point A at a first end of the section 10. A second measurement device in the form of a second distance protective device 11b is arranged in a corresponding manner at a second measurement point B at a second end of the section 10. In the illustrated example shown in FIG. 1, the measurement devices are electrical distance protective devices 11a and 11b; however, it is also possible to use electrical measurement devices without an additional protective function, for example so-called phasor measurement units (PMUs) at the measurement points A and B.

First current and voltage phasor measured values are recorded from each of the three phases 10a, 10b, 10c and from the common electrical ground 10d at the measurement point A by means of current and voltage instrument transformers, which are only indicated schematically, and these measured values are supplied to the first distance protective device 11a. Second current and voltage phasor measured values are recorded in a corresponding manner from each of the three phases 10a, 10b, 10c and from the common electrical ground 10d at the measurement point B, and are supplied to the second distance protective device.

The two distance protective devices 11a and 11b are designed to run a distance protection algorithm on the basis of the recorded current and voltage phasor measured values and to emit a trip signal (trip command) to corresponding circuit breakers 12a, 12b and 12c at the first end of the section 10, and electrical circuit breakers 13a, 13b and 13c at the second end of the section 10, in the situation where a fault, such as a short, is identified on the section 10 of the electrical power supply line. This causes the corresponding circuit breakers 12a, 12b, 12c and 13a, 13b, 13c to open their switching contacts in order in this way to isolate the faulty phases of the electrical power supply line from the rest of the power supply system.

The distance protective devices 11a and 11b are also connected to one another via a communication link 14, in which case the communication link may be either based on cables or may be wire-free, and need not exist or be active all the time between the two measurement devices 11a and 11b. By way of example, it is possible to set up a temporary communication link in the form of a radio link between the two measurement devices, or to set up a temporary telecommunications link between the two measurement devices, via appropriate modem devices. Furthermore, the communication link may be in the form of a communication link with a comparatively low data transmission capacity.

The method of operation of the system illustrated in FIG. 1 will be explained in more detail in the following text with reference to FIGS. 1 and 2. For this purpose, it is assumed that a ground short, as indicated by a lightning symbol 15 in FIG. 1, has occurred between the phase 10c of the section 10 and the electrical ground 10d. The distance protective devices 11a and 11b identify the short that has occurred by continuously recording the current and voltage phasors at the respective measurement points A and B and using them first of all to calculate the impedances of all the loops that exist, that is to say of the three conductor-conductor loops (phase 10a to phase 10b, phase 10a to phase 10c, phase 10b to phase 10c) and the three phase-ground loops (phase 10a to ground 10d, phase 10b to ground 10d, and phase 10c to ground 10d). The section 10 is checked for faults by comparison of the determined impedances with characteristics that are stored in the device. In the event of a fault, the type of fault is determined, that is to say whether it is a conductor-conductor short or a conductor-ground short. In addition, the phases involved in the fault are determined. The calculated impedance can also be used to deduce the fault location where the short has occurred. When a fault occurs, the relevant phases are disconnected from the rest of the power supply system via the associated circuit breakers 12a, 12b, 12c and 13a, 13b, 13c. By way of example, FIG. 1 shows that phase 10c of the section 10 of the electrical power supply line which is affected by the ground short having been switched off via the circuit breakers 12c and 13c, which are shown as having opened.

In the event of a phase-phase short, the fault identification and the fault location can be carried out comparatively easily, because the line impedances are normally known with high precision. In the case of the conductor-ground short illustrated in FIG. 1, the short-circuit current in fact flows back from the relevant phase 10c via the electrical ground 10d to the respective distance protective device 11a and 11b. The ground impedance which exists in this case is normally not known with high precision and until now has had to be determined by complex measurements, for which the section 10 had to be disconnected from the rest of the power supply system, or estimates, and be entered as the parameter in the respective distance protective device.

The following text therefore explains a method by means of which it is possible to determine a setting value for the ground impedance in a simple manner, which setting value is comparatively accurate and does not require the section 10 to be disconnected from the power transmission line.

Figure 2:
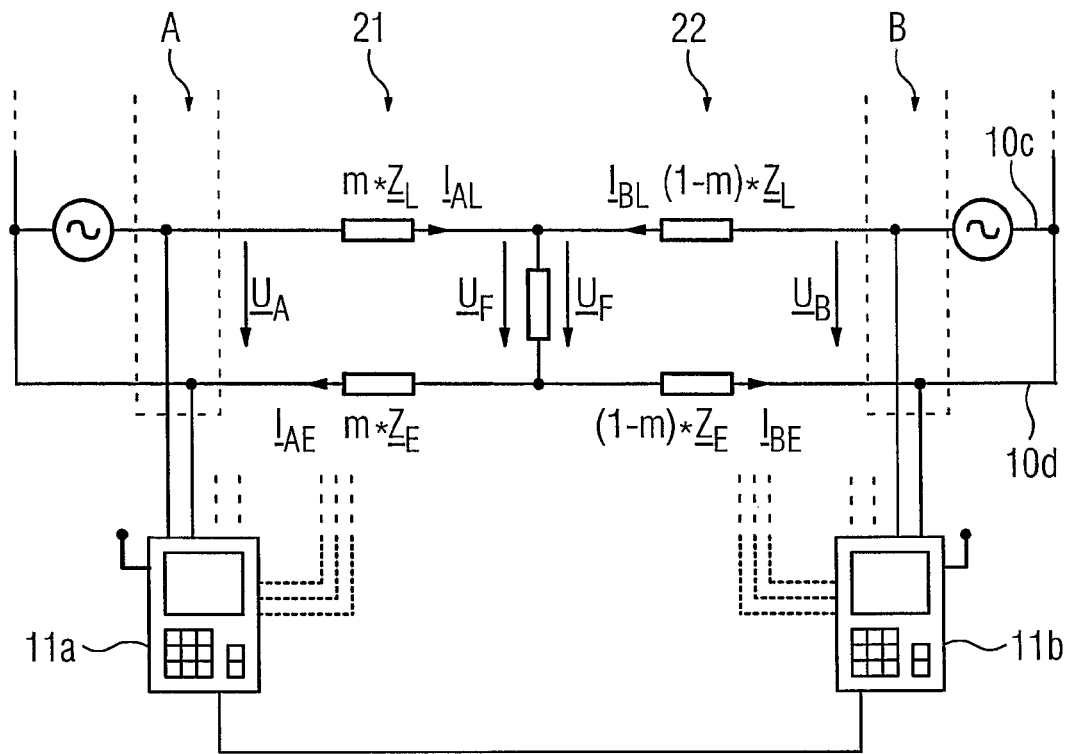
FIG. 2 shows a schematic illustration of one phase of a section of a three-phase power transmission line.

For this purpose, the calculation of a fault location value m will first of all be derived with reference to FIG. 2. This fault location value m indicates the location at which the short has occurred between the phase 10c and the electrical ground 10d. The known loop rule, according to Kirchhoff's second law, is for this purpose applied to the loops 21 and 22 shown in FIG. 2, which each exist between the short and the respective distance protective device 11a and 11b. This results in the following loop equation for the loop 21 between the first distance protective device 11a and the short (1):

$$-\underline{U}_A + \underline{I}_{AL} \cdot m \cdot \underline{Z}_L + \underline{U}_F + \underline{I}_{AE} \cdot m \cdot \underline{Z}_E = 0 \quad (1)$$

In this case, the meanings of the symbols in the formula are (cf. also FIG. 2):

$\underline{U}_A$: the voltage phasor, as measured by the first distance protective device 11a, which indicates the voltage between the phase 10c and the electrical ground 10d;

$\underline{I}_{AL}$: the current phasor, as measured by the first distance protective device 11a, which indicates the current flowing in the phase 10c;

m: the distance from the first distance protective device 11a to the fault location, with respect to the total length of the section 10;

$\underline{Z}_L$: the positive phase sequence system impedance of the phase 10c of the section 10 of the line;

$\underline{U}_F$: the voltage drop at the fault location;

$\underline{I}_{AE}$: the ground current phasor, as measured by the first distance protective device 11a, which indicates the current flowing in the electrical ground 10d; and $\underline{Z}_E$: the ground impedance.

The loop equation (2) for the second loop 22 between the second distance protective device 11b and the short can be defined correspondingly as follows:

$$-\underline{U}_B + \underline{I}_{BL} \cdot (1-m) \cdot \underline{Z}_L + \underline{U}_F + \underline{I}_{BE} \cdot (1-m) \cdot \underline{Z}_E = 0 \quad (2)$$

In this case, the meanings of the additional symbols in the formula are (cf. FIG. 2 as well):

$\underline{U}_B$: the voltage phasor, as measured by the second distance protective device 11b, which indicates the voltage between the phase 10c and the electrical ground 10d;

$\underline{I}_{BL}$: the current phasor, as measured by the second distance protective device 11b, which indicates the current flowing in the phase 10c; and $\underline{I}_{BE}$: the ground current phasor, as measured by the second distance protective device 11b, which indicates the current flowing in the electrical ground 10d.

The distance protective device 11a or 11b can use the respective equation to determine a fault location value m which indicates the fault location. However, to do so, the setting values for the positive phase sequence system impedance of the line and the ground impedance must be available in the respective distance protective device 11a or 11b as parameters.

When the distance protective devices 11a and 11b are initially put into operation, a setting value derived from empirical values may, for example, be used as an initial value for the ground impedance parameter. By way of example, in order to determine a possible initial value, it is therefore possible to use the empirical value that the ratio of both the real part and the imaginary part between the zero phase sequence system impedance and the positive phase sequence system impedance of an electrical power transmission line is normally approximately equal to unity. It is possible to use this to estimate a setting value for the ground impedance which, although not highly accurate, in any case ensures the functionality of the distance protective devices, however.

During operation, the distance protective devices 11a and 11b each record current and voltage phasor measured values and check whether a fault has occurred on the monitored section 10. If a ground short has occurred on one phase of the section 10 of the electrical power supply line, then the relevant phase is first of all isolated from the rest of the electrical power supply system, by means of circuit breakers.

After successful disconnection of the relevant phase of the electrical power supply line, the current and voltage phasor measured values which were recorded at the time of the ground short and were stored in internal data memories in the distance protective devices can be transmitted via the communication link 14 between the distance protective devices 11a and 11b. Unidirectional transmission may be used in this case, in which, by way of example, the current and voltage phasor measured values recorded by the second distance protective device 11b are transmitted to the first distance protective device. Alternatively, bidirectional transmission may also be used, in which both distance protective devices 11a and 11b transmit their current and voltage phasor measured values to the respective other distance protective device. Since the ground short has already been disconnected at this point in time, the respective current and voltage phasor measured values can be transmitted over a time period of any desired length, which means that a link with a comparatively low data transmission capacity is sufficient for the communication link 14.

A so-called two-ended fault location algorithm can then be run using the current and voltage phasor measured values recorded at that end at the time of the ground short and the current and voltage phasor measured values recorded from the remote end of the section 10, by means of which algorithm the fault location at which the ground short has occurred can be determined very accurately. A number of possible fault location methods are known from the prior art for this purpose, and, for example, it is possible to use the two-ended fault location algorithm as described in German patent is possible to use the two-ended fault location algorithm as described in German patent specification DE 4441334 C1. The fault location value m can be determined using a two-ended fault location algorithm such as this, and indicates the fault location of the ground short with respect to the overall conductor length.

$$m = \frac{l_{A-F}}{l_{ges}} \quad (3)$$

The meanings in this case are as follows:

$l_{A-F}$: length of the section 10 from the measurement point A to the fault location;

$l_{ges}$: length of the entire section 10.

The particular advantage of using a two-ended fault location algorithm such as this is that it makes use of current and voltage phasor measured values from both ends of the section 10, and can therefore be carried out without any knowledge of the ground impedance.

The fault location value m determined by means of the two-ended fault location algorithm can then be used to determine the ground impedance appropriate for the fault location value m, as calculated using the two-ended fault location algorithm, in that distance protective device in which the current phasor measured values from both ends are available (that is to say with unidirectional transmission in one distance protective device and with bidirectional transmission in both distance protective devices), using the appropriate mesh equation (1) or (2).

In other words, that ground impedance is in this case calculated which would have resulted in the same fault location as in the case of the two-ended fault location calculation, when using one-ended fault location solely by the first or second distance protective device 11a or 11b.

By way of example, this is done by reorganization of equation (1) for the first distance protective device, resulting in the following equation (4):

$$Z_E = \frac{U_A - I_{AL} \cdot m \cdot Z_L - U_F}{m \cdot I_{AE}} \quad (4)$$

In a corresponding manner, the following equation (5) is determined as a calculation equation for the ground impedance by reorganization of equation (2) for the second distance protective device 11b.

$$Z_E = \frac{U_B - I_{BL} \cdot (1-m) \cdot Z_L - U_F}{(1-m) \cdot I_{BE}} \quad (5)$$

Some methods for two-ended fault location, such as the two-ended fault location method described in the cited patent specification DE 4441334 C1, also produce as a result a value for the voltage drop $U_F$ at the fault location, as a result of which this value can be transferred directly to the respective calculation equation (4) or (5). If the voltage drop $U_F$ at the fault location is not known, then it can also be ignored without any major influence on the final result.

Since the other values which are required for equations (4) and (5) are known either by measurement or as line parameters, the ground impedance $Z_E$ can be determined without any problems. The ground impedance calculated in this way can subsequently be used as a setting value for the ground impedance parameter in the distance protective devices 11a and 11b.

If the ground impedance setting value is calculated in both distance protective devices 11a and 11b, then the two results for the ground impedance can be compared with one another. If excessive discrepancies occur between the two results, then it is possible to reject the calculated setting values because of the uncertainty in the results, and not to use them as a parameter for the distance protective devices 11a and 11b.

It is also possible to carry out the method for calculation of the ground impedance setting values repeatedly, first of all, by waiting for a number of ground shorts, and then forming a mean value from the plurality of calculated ground impedance setting values. In this case, the mean value is then used as the new ground impedance setting value for the distance protective devices 11a and 11b.

The described method likewise allows continuous adaptation of the setting value for the ground impedance in order, for example, to take account of a change in the ground itself on the basis of different moisture values or different influencing factors.

One particular advantage of the described method is that the calculation of the setting value for the ground impedance is not carried out on a time-critical basis, that is to say the respective circuit breakers are first of all tripped in order to disconnect the fault from the electrical power supply system, and the setting value need not be calculated until this has been done. In consequence, the demands on the communication link 14 are kept comparatively low, since the transmission time between the distance protective devices 11a and 11b is irrelevant.

The distance protective devices 11a and 11b can record the current and voltage phasor measured values, for example, in a non-synchronous manner. In this case, the algorithm which is used for two-ended fault location must be an algorithm which, so to speak, retrospectively synchronizes the current and voltage phasor measured values from the two ends of the section 10 of the electrical power supply line, and then calculates the fault location value m. When using a method such as this, there must normally be a continuous communication link between the distance protective devices.

However, it is also possible for the distance protective devices 11a and 11b to record their current and voltage phasor measured values in a time-synchronous manner, that is to say with the sampling in the two distance protective devices being carried out synchronously. For this purpose, the distance protective devices 11a and 11b each have internal timers, which are synchronized to one another via an external timer. By way of example, a GPS satellite can be used as an external timer, which transmits a signal at regular intervals (for example at an interval of one second), from which an absolute time signal can be extracted. The distance protective devices synchronize their internal timers to the external timer by receiving the GPS signals via antennas 17a and 17b (see FIG. 1) and extracting the time signal from the GPS signal by means of GPS receiver modules, which are not shown. Any other desired externally produced time signal may also be used instead of a GPS signal.

In addition, the current and voltage phasor measured values are allocated a time stamp which precisely indicates the point in time of their recording, for example to a microsecond, thus allowing the mutually associated current and voltage phasor measured values from the two ends of the section 10 to be associated with one another in a simple manner for the two-ended fault location method. The time stamp is transmitted together with the respective current and voltage phasor measured values between the distance protective devices 11a and 11b. With time-stamped current and voltage phasor measured values such as these, a purely temporarily existing communication link between the distance protective devices is also adequate. If no communication link exists between the distance protective devices, then, in this case, it is also possible to transmit the current and voltage phasor measured values manually between the distance protective devices, by means of a data storage medium.

Although distance protective devices 11a and 11b are used as measurement devices in conjunction with FIGS. 1 and 2, there is no need in the described method for calculation of a setting value for the ground impedance for the current and voltage phasors to be measured by distance protective devices, or for the fault location value and the setting value to be calculated in a distance protective device. In fact, so-called phasor measurement units (PMUs) can also be used for this purpose, and are used as measurement units instead of the distance protective devices 11a and 11b. In this case, the phasor measurement units have only measurement inputs for recording the current and voltage phasors, but no command output in order to output a trip signal to corresponding circuit breakers. A setting value determined in this way using phasor measurement units must then be entered, for example manually, in the distance protective devices.

Figure 3:
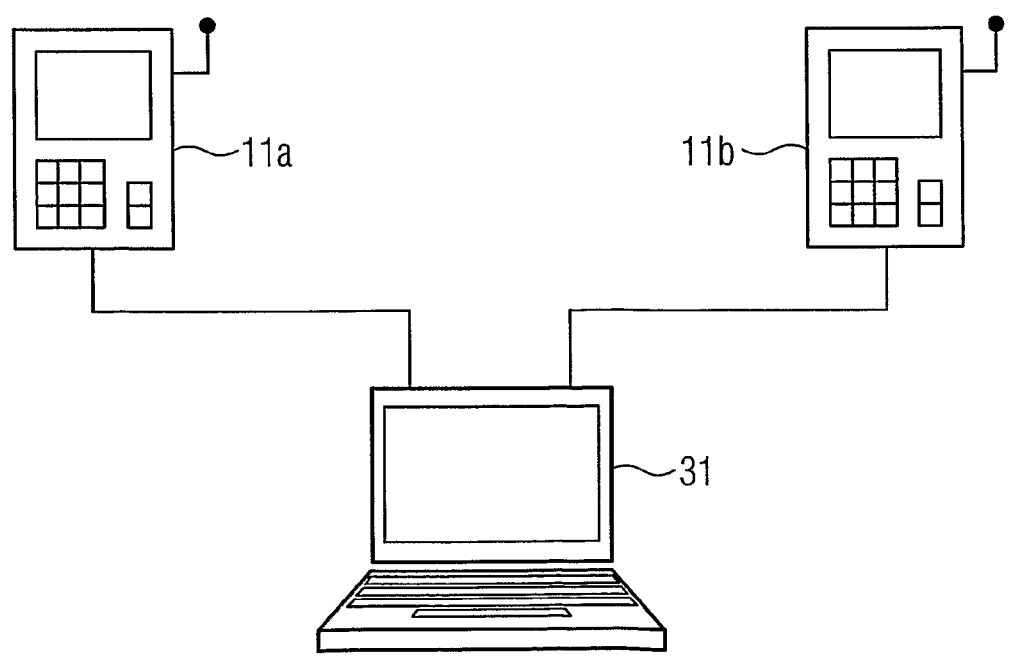
FIG. 3 shows a schematic illustration of two measurement devices, which are connected to a computation device via a communication link.

FIG. 3 shows an alternative option, in which the distance protective devices 11a and 11b do not themselves calculate the setting value, but transmit the measured current and voltage phasor measured values to an external computation device 31. By way of example, this may be a portable computer such as a laptop or a computer in a control console. The transmission can be carried out, corresponding to the situation illustrated in FIG. 1, either by means of a continuously existing communication link or a temporarily set-up communication link between the distance protective devices 11a and 11b and the external computation device 31. If the measurements of current and voltage phasor measured values are not carried out in a time-synchronized manner in the two distance protective devices, then a communication link must exist all the time between the two distance protective devices 11a and 11b and the computation device 31, in order to ensure retrospective synchronization of the current and voltage phasor measured values of the different distance protective devices 11a or 11b. A continuous communication link is no longer necessary if the current and voltage phasor measured values are recorded in a time-synchronous manner, and are provided with a time stamp. In this case, it is also possible to connect the computation device 31 successively, manually, to the two distance protective devices 11a and 11b. By way of example, this can be done using a data cable or a separate data storage medium, such as a USB stick, in order to transmit the current and voltage phasor measured values from the internal data memory in the respective distance protective device 11a or 11b to the external computation device 31.

In the external computation device 31, the steps to calculate a fault location value m, as already described in conjunction with FIGS. 1 and 2, are carried out in a corresponding manner using a two-ended fault location algorithm, and the setting value which indicates the ground impedance is calculated in a corresponding manner. The setting value can then be transmitted back either manually or automatically via an existing communication link to the distance protective devices 11a and 11b in order to set the ground impedance parameter.

In the exemplary embodiment shown in FIG. 3, it is also possible to use phasor measurement units instead of distance protective devices 11a and 11b, which units measure only current and voltage phasors and transmit them to the external data processing device.

Figure 4:
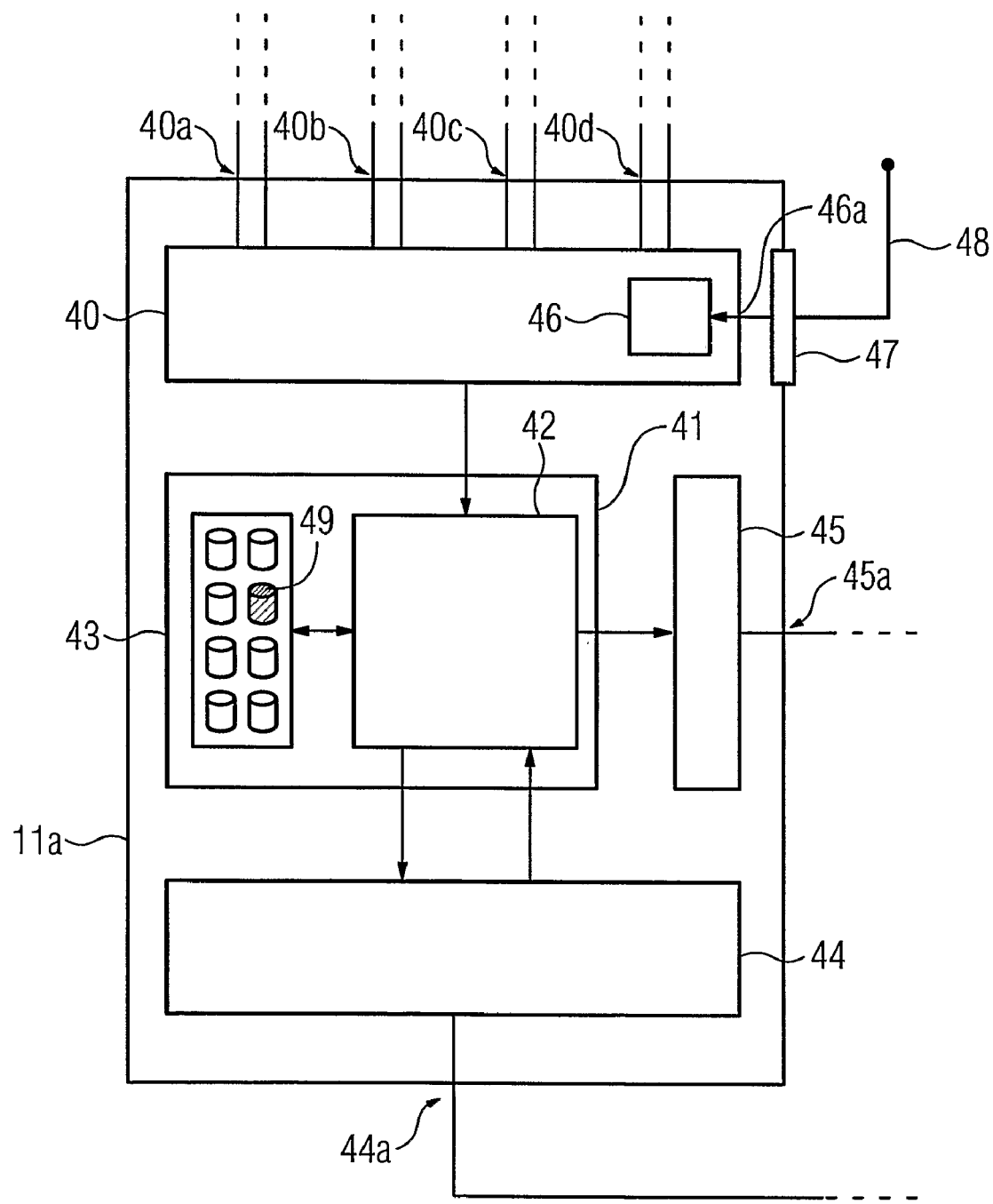
FIG. 4 shows a schematic block diagram to explain the method of operation of a measurement device.

FIG. 4 shows a detailed view of the components of a measurement device in the form of the distance protective device 11a. The distance protective device 11a has a recording device 40 whose input side is connected to measurement inputs 40a, 40b, 40c and 40d, via which current and voltage phasor measured values of the three phases and the electrical ground are recorded. The recording device 40 is connected to a data processing device 41, which has an internal computation device 42, for example a microprocessor, and a memory device 43 for storage of setting values for the distance protective device 11a. The data processing device 41 is in turn connected to a communication device 44, which has a transmitting and receiving interface 44a. In addition, the data processing device 41 is connected to a command module 45, which has a command output 45a on the output side.

Furthermore, the recording device 40 may have an internal timer 46, which clocks the sampling of the current and voltage phasor measured values of the measurement inputs 40a to 40d. Furthermore, the internal timer 46 may have a synchronization input 46a, which is connected to a receiver for an external time signal 47, for example to a GPS receiver. The receiver for the external time signal 47 has an antenna 48, for example, in order to receive the external time signal.

Instead of having an antenna, if the external time signal is transmitted, for example, via a cable-based network, it is also possible to provide a correspondingly different interface, for example an Ethernet interface for receiving an external time signal, which is transmitted via an Ethernet network.

In the manner already described, the data processing device 41 calculates a setting value for the ground impedance, and stores this as a ground impedance parameter 49 in the memory device 43. Other parameters, for example line impedance parameters and characteristics, are normally also stored in the memory device 43.

In order to carry out the distance protective method, the computation unit 42 can access the memory device 43 and can call up the ground impedance parameter 49 stored there, in order to carry out the protection algorithms. The method carried out by the data processing device 41 will be summarized once again briefly, with reference to FIG. 5.

In a first step 51, the distance protective device 11a records first current and voltage phasor measured values via the measurement inputs 40a to 40d of the recording device 40. The recording of the first current and voltage phasor measured values is clocked via the internal timer 46, which is synchronized by means of the external time signal received via the antenna 48 and the receiver 47. The recorded current and voltage phasor measured values are transmitted to the computation device 42 of the data processing device 41. In a second step 52, this checks whether at least one of the three phases is affected by a short. To do this, the internal computation device 42 accesses the parameters stored in the data memory 43, with the ground impedance parameter 49 also being used, inter alia, in the event of a ground short.

If the computation device 42 identifies a fault on one of the phases of the section 10 of the electrical power transmission line, then a signal is emitted to the command module 45, which emits a trip command for the appropriate circuit breaker at its command output 45a, in order to isolate the relevant phase of the section of the electrical power transmission line from the rest of the power transmission system.

If a fault has been identified in step 52, then, in a further step 53, second current and voltage phasor measured values, which have been recorded at a second distance protective device (for example the distance protective device 11b), are received by means of the communication device 44. If it is also intended to calculate the setting value for the ground impedance in the second distance protective device, then, in step 53, the first current and voltage phasor measured values recorded by the first distance protective device 11a itself are also transmitted via the communication device 44 to the second distance protective device.

The received second current and voltage phasor measured values are supplied to the computation device 42 which, in a subsequent step 54, determines the fault location value m using the first and the second current and voltage phasor measured values, by means of a two-ended fault location algorithm.

In a final step 55, the fault location value m is used to calculate a setting value for the ground impedance. By way of example, equation (4) is used for this purpose.

The setting value calculated in this way for the ground impedance can either be stored immediately as a new parameter for the ground impedance in the data memory 43, therefore replacing the parameter 49 for the ground impedance, or alternatively, for example, it is also possible for the parameter 49 for the ground impedance to be replaced only when there is a minimum discrepancy between the newly calculated setting value and the ground impedance parameter 49 already present in the data memory 43.

As already mentioned above, it is also possible to first of all wait for a certain number of ground shorts, and to calculate a setting value for the ground impedance in the described manner for each ground short. The respectively calculated setting values for the ground impedance are stored in the data memory 43. However, they are not used as the parameter 49 for the ground impedance. Only when a specific number of setting values have been calculated is a mean value determined over the previously calculated setting values, with this mean value being set as the new ground impedance parameter 49 in the distance protective device 11a.

The setting of the parameter 49 either directly from each calculated setting value or from a mean value of a plurality of calculated setting values can either be carried out automatically by the distance protective device or can be set manually by an operator of the distance protective device. In the last-mentioned case, the electrical distance protective device 11a indicates, via a display which is not shown in FIG. 4, to the operator a proposal for setting the ground impedance parameter 49, by which means the operator of the distance protective device 11a can himself decide whether he does or does not wish to use the proposed value as the ground impedance parameter 49.

Figure 5:
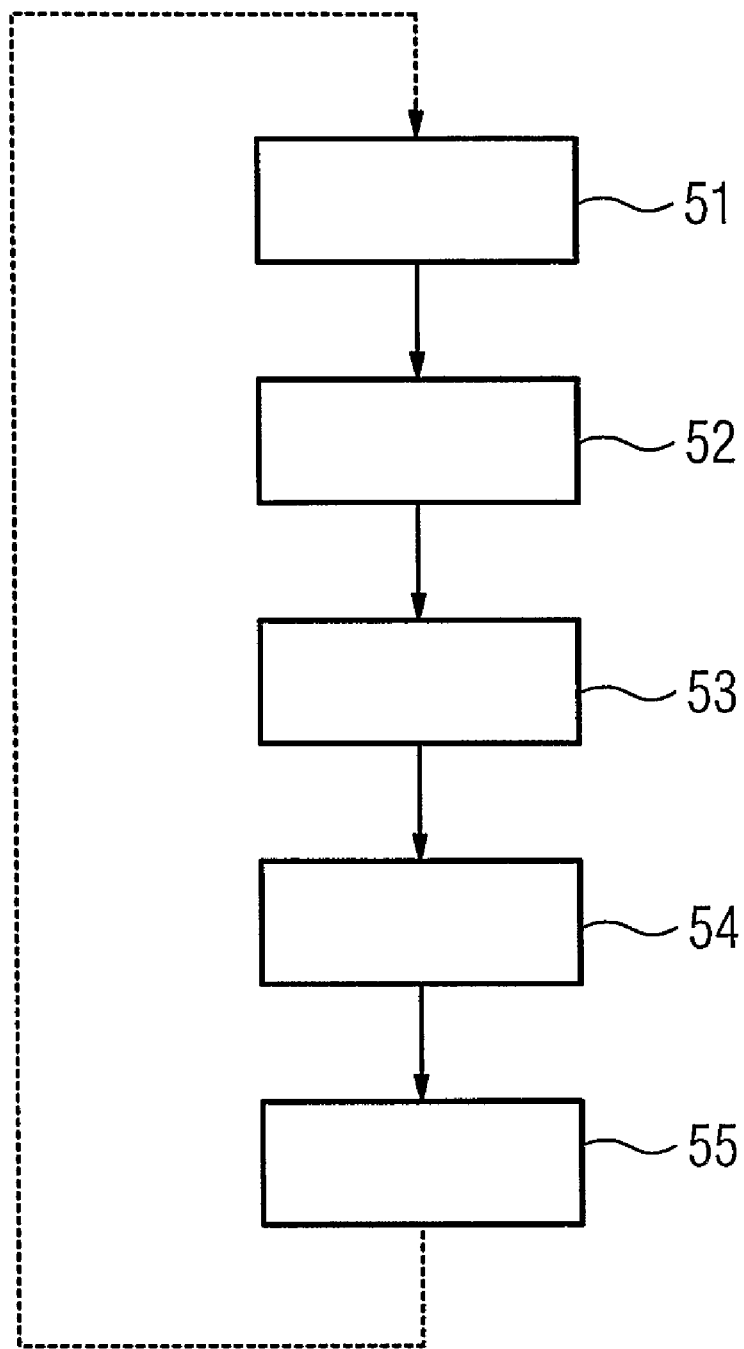
FIG. 5 shows a schematic method flowchart to explain a method for determination of a setting value which indicates a ground impedance.

The method shown in FIG. 5 can be repeated continually, such that it is possible to adaptively record changes in the ground impedance in the distance protective devices 11a and 11b.

The invention claimed is:

1. A method for determining a setting value for an electrical protective device, the method which comprises, on occurrence of a ground short on a section of an electrical power supply line:
   recording first current phasor measured values and first voltage phasor measured values using a first measurement device at a first end of the section of the electrical power supply line;
   recording second current phasor measured values and second voltage phasor measured values using a second measurement device at a second end of the section of the electrical power supply line;
   determining from the first current phasor measured values, the first voltage phasor measured values, the second current phasor measured values, and the second voltage phasor measured values a fault location value indicating a fault location at which the ground short has occurred on the section of the electrical power supply line; and
   calculating, from the fault location value, a setting value indicating a ground impedance.

2. The method according to claim 1, wherein the step of calculating the setting value comprises calculating the following:

$$Z_E = \frac{U_a - I_{aL} m Z_L - U_F}{m I_{aE}}$$

where:
$Z_E$: ground impedance;
$U_a$: voltage phasor measured by the first measurement device;
$I_{aL}$: current phasor measured by the first measurement device;
m: distance from the first measurement device to the fault location, with respect to the length of the section of the line;
$Z_L$: positive phase sequence system impedance of the section of the line;
$U_F$: voltage drop at the fault location; and
$I_{aE}$: ground current measured by the first measurement device.

3. The method according to claim 1, which comprises recording the first current and voltage phasor measured values with the first measurement device, and recording the second current and voltage phasor measured values with the second measurement device, synchronously in time.

4. The method according to claim 3, which comprises providing the first and second current and voltage phasor measured values with a time stamp indicating a point in time at which the respective current and voltage phasor measured values were recorded.

5. The method according to claim 4, which comprises generating the time stamp with an internal timer in the respective measurement device.

6. The method according to claim 5, wherein the respective internal timers of the measurement devices are synchronized via a common external timer.

7. The method according to claim 1, which comprises transmitting the recorded second current and voltage phasor measured values via a communication link from the second measurement device to the first measurement device.

8. The method according to claim 7, which comprises calculating the fault location value and the setting value with the first measurement device.

9. The method according to claim 1, which comprises transmitting the first current and voltage phasor measured values from the first measurement device to the second measurement device and transmitting the second current and voltage phasor measured values from the second measurement device to the first measurement device via a communication link.

10. The method according to claim 9, which comprises calculating the fault location value and the setting value with both the first and second measurement devices.

11. The method according to claim 1, which comprises:
    transmitting the first current and voltage phasor measured values from the first measurement device to a computation device;
    transmitting the second current and voltage phasor measured values from the second measurement device to the computation device; and
    calculating the fault location value and the setting value with the computation device.

12. The method according to claim 1, which comprises using the setting value to set a ground impedance parameter of an electrical distance protective device.

13. The method according to claim 1, which comprises:
    calculating a setting value for each of a plurality of ground shorts; and
    determining a mean value from the calculated setting values and using the mean value to set a ground impedance parameter of a distance protective device.

14. A measurement device, comprising:
    a recording device configured to record first current phasor measured values and first voltage phasor measured values present during a ground short on a section of a power transmission line at a first end of the section of the power transmission line;
    a communication device, configured to receive second current phasor measured values and second voltage phasor measured values recorded by way of a further measurement device during the ground short at a second end of the section; and
    a data processing device configured to:
        calculate a fault location value, indicating a location of the ground short on the section, from the recorded first current and voltage phasor measured values and the second current and voltage phasor measured values; and
        calculate a setting value, indicating a ground impedance, from the fault location value.

15. The measurement device according to claim 14, embodied in an electrical distance protective device.

* * * * *